United States Patent [19]
Hamasaki

[11] Patent Number: 5,821,750
[45] Date of Patent: Oct. 13, 1998

[54] CCD MAGNETIC FIELD DETECTING APPARATUS

[75] Inventor: Masaharu Hamasaki, Kanagawa, Japan

[73] Assignee: Sony Corporation, Tokyo, Japan

[21] Appl. No.: 711,231

[21] Appl. No.:

[22] Filed: Sep. 9, 1996

[30] Foreign Application Priority Data

Sep. 7, 1995 [JP] Japan .................................. 7-255691

[51] Int. Cl.$^6$ ........................ H01L 29/76; H01L 29/82; G01R 33/02
[52] U.S. Cl. ........................................ 324/252; 257/421
[58] Field of Search ............................ 324/252; 257/421, 257/424, 215, 222, 238, 241

[56] References Cited

U.S. PATENT DOCUMENTS 5,591,996  1/1997  Haigh et al. ............................ 257/238

*Primary Examiner*—Walter E. Snow
*Attorney, Agent, or Firm*—Hill & Simpson

[57] ABSTRACT

A plurality (e.g., an odd number) of CCD shift registers are provided in parallel, and a channel stop separates between the respective adjacent CCD shift registers and is partially cut out in order to make it possible for a carrier which passes through the CCD shift registers to move toward the side portion. Carrier (electrons) supplied from an input section to the center CCD shift register are measured at the outputs of the other CCD shift registers, and the intensity (the magnetic-flux density) of the magnetic field is determined on the basis of the absolute value thereof, and the direction of the lines of magnetic force is determined on the basis of whether the difference is positive or negative.

14 Claims, 5 Drawing Sheets

⊙ OR ⊗ : DIRECTION OF MAGNETIC FIELD

⊙ OR ⊗ : DIRECTION OF MAGNETIC FIELD

CCD MAGNETIC FIELD DETECTING APPARATUS

BACKGROUND OF THE INVENTION

1. Field of the Invention

The present invention relates generally to the field of magnetic-field detecting devices, more particularly, the present invention relates to a magnetic field detecting device having increased sensitivity without decreased S/N ratio and which easily reduces an offset.

2. Description of the Related Art

A hall element which utilizes the hall effect is a known device for detecting a magnetic field, and is used as, for example, a non-contact rotation phase detector of a brushless motor. The hall effect refers to a phenomenon in which when electric current is made to flow through a thin piece of a solid of a semiconductor, a metal or the like, and a magnetic field is applied to the electric current at right angles thereto, a voltage is generated in a direction at right angles to both the direction of the electric current and the direction of the magnetic field. FIG. 6 is a plan view illustrating an example of a conventional Hall effect device.

In FIG. 6, reference character "a" denotes a channel formed on the surface portion of a semiconductor board, and when a voltage E is applied across both ends of the channel via a current adjustment variable resistor VR, an electric current I flows. Reference character VH denotes a voltage at right angles to that generated in the channel a, and reference character V denotes a voltage generated in a part of the channel a. The ratio of V to VH is a hall coefficient R (=1/n·e·c wherein n=the number of electrons, e=the charge of the electrons, and C=the velocity of light).

FIG. 7 is a sectional view illustrating a bipolar type magnetic-field detecting apparatus which is another conventional example. This magnetic-field detecting apparatus is designed to detect the intensity and the direction of the magnetic field by utilizing the fact that the collector is separated into two and the flow of electrons which are ejected from the emitter to the base and which are collected to the collector from the base is shifted to either one of the collectors due to the magnetic field. In other words, the magnetic field is determined by the difference between electric currents I1 and I2 which flow through the two collectors C1 and C2.

In the conventional apparatus shown in FIG. 6, because the hall coefficient R is inversely proportional to the number n of electrons, its sensitivity can be increased by reducing the number n of electrons. However, when the number n of electrons is reduced, the S/N ratio becomes poor. Therefore, as a result, the conventional apparatus has a problem in that it is difficult to increase its sensitivity.

Further, in the conventional apparatus shown in FIG. 7, because the distance it takes for the carrier to move from the emitter to the collector (almost the thickness of the base) is extremely short, the deflection amount of the passage of the carrier due to the magnetic field does not become large. For this reason, the conventional apparatus has a problem in that it is difficult to increase its sensitivity.

Further, the shapes and sizes of the emitter, the base and the two collectors are not determined by a single mask pattern, and have a possibility that the shapes and sizes might be offset due to mask misalignment. The misalignment causes an offset. For this reason, there is a drawback in that an offset is likely to occur in the detection result due to the mask misalignment.

The present invention is directed to solving such problems. It is an object of the present invention to provide a magnetic-field detecting apparatus having high sensitivity and excellent S/N ratio, and having no possibility of an offset occurring.

SUMMARY OF THE INVENTION

In the magnetic-field detecting apparatus of the present invention, a plurality of CCD shift registers are provided in parallel, a channel strip for separating between the respective adjacent CCD shift registers is partially cut out so as to make it possible for a carrier which passes through the CCD shift registers to move toward the side. A magnetic field can be detected based on the difference or the ratio of the outputs of each of the CCD shift registers.

Accordingly, in the magnetic-field detecting apparatus of the present invention, when a magnetic field in a direction at right angles to the CCD shift registers is present, the flow of the carrier flowing through each CCD shift register is bent in a direction corresponding to the direction of the magnetic field, and a part of the carrier flows into the adjacent CCD shift register through the cutout portion of the channel stop. This causes an unbalance of the outputs of the plurality of the CCD shift registers. The stronger the magnetic field, the greater this unbalance.

Therefore, it is possible to measure the intensity of the magnetic field from the difference or the ratio of the outputs of each CCD shift register. Further, since the magnitude relation of the outputs of the plurality of the CCD shift registers is reversed depending upon the direction of the magnetic field, it is possible to determine the direction of the magnetic field (the lines of the magnetic force) according to the magnitude relation.

Further, since the deflection amount of the flow of the carrier with respect to the intensity of the same magnetic field can be increased on the basis of the length of the channel and the number of cutoff portions of the channel stop, a magnetic-field detecting apparatus can be provided in which it is considerably easier to increase sensitivity without providing a reduction in S/N ratio, such as, for example, the number of electrons being reduced as in a normal hall element.

Further, the variations in the length and the width of each CCD shift register cause an offset of the magnetic-field detecting apparatus. However, the length and the width of each CCD shift register can be determined by a single mask for forming a channel stop, and variations due to the mask misalignment do not occur. Therefore, manufacture control is extremely easy as compared with the formation of each region of a bipolar transistor type magnetic-field detecting apparatus which is formed by a plurality of masks and which has the possibility that variations in the shape and the size will occur due to mask misalignment. In particular, this may occur in the formation of the collector region. Therefore, it is extremely easy to prevent an offset from occurring in the output of the magnetic-field detecting apparatus.

BRIEF DESCRIPTION OF THE DRAWINGS

The present invention will be explained below with reference to the figures wherein.

DETAILED DESCRIPTION OF THE PREFERRED EMBODIMENTS

Figure 1A:
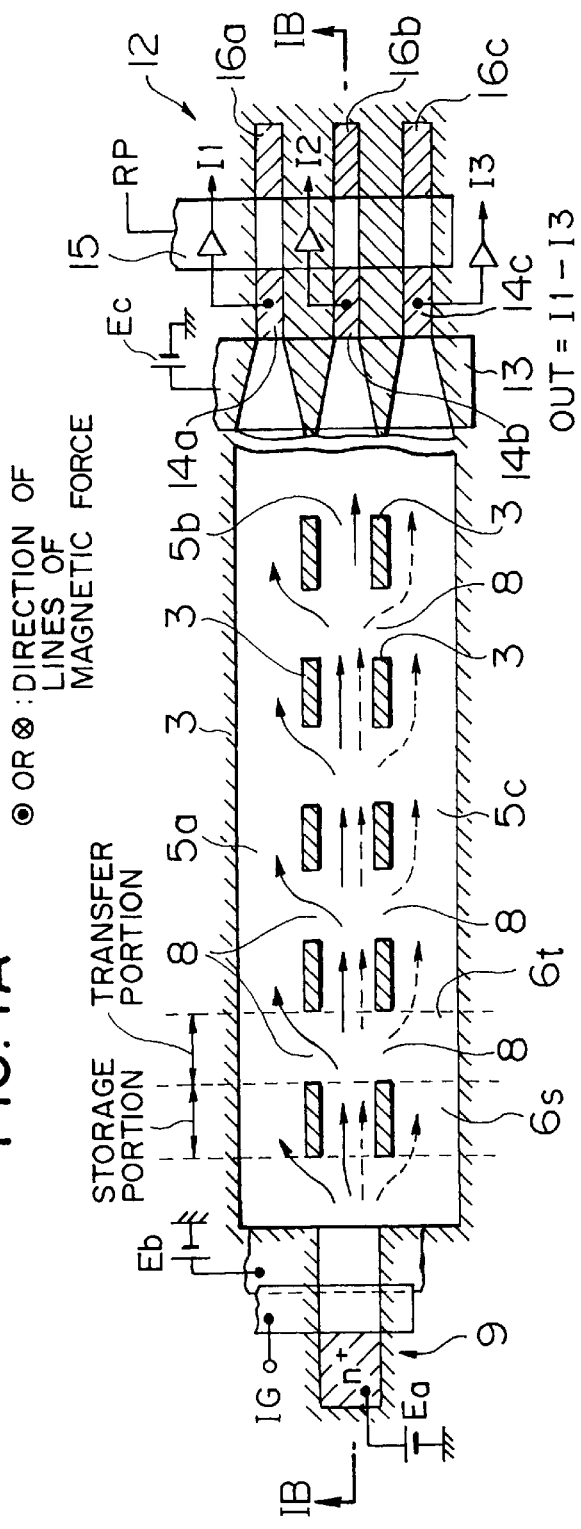
FIGS. 1(A) is a plan view of an embodiment of a magnetic-field detecting apparatus of the present invention.

In FIGS. 1(a) and (b), reference numeral 1 denotes a p-type semiconductor substrate. Reference numeral 2 denotes an n-type buried channel formed on the surface of the p-type semiconductor substrate 1. Reference numeral 3 denotes a channel stop. Reference numeral 4 denotes a gate insulating film formed on the surface of the p-type semiconductor substrate 1. Reference numerals 5a, 5b and 5c denote three CCD shift registers formed in parallel by separating the buried channel 2 by the channel stop 3.

The CCD shift registers 5a, 5b and 5c perform a concurrent operation of transferring electrons in accordance with common two-phase transfer pulses V1 and V2. Reference numerals 6s, and 6t denote n-type regions which form a transfer portion of each CCD shift register 5. Reference numerals 7, denote transfer electrodes which control the transfer of electrons in response to the two-phase transfer pulses V1 and V2. An illustration of the transfer electrodes is omitted in FIG. 1(A) for the sake of convenience.

Reference numerals 8, denote cutout portions formed in the channel stop 3 for separating between the respective adjacent CCD shift registers (between 5a and 5b, and between 5b and 5c), which cutout portions are provided at places corresponding to each transfer portion 6t. Therefore, the electrons, which are a carrier which flows through each of the CCD shift registers 5a, 5b and 5c, can enter the adjacent CCD shift register 5 through the cutout portions 8, as a result of the bending of the flow thereof when a magnetic field occurs.

The reason why the cutout portions 8, are not provided at places corresponding to the storage portion 6s is because there is a possibility that the electrons will diffuse from the storage portion 6s to the area around the storage portion 6s during the storage time and normal transfer cannot be performed. In the case in which the cutout portions 8, are provided at places corresponding to the transfer portion 6t, as in this example, the electrons are able to move to the adjacent CCD shift register 5 only in a short momentary period during which the electrons pass through the transfer portion 6t while the electrons are moving to the storage portion 6s, and thereafter immediately the electrons settle in the storage portion 6s. Therefore, there is no possibility that normal transfer will be hindered. Further, since the charge does not receive repulsion from the charge which is bent earlier since the charge collects in the storage portion, high sensitivity can be achieved.

It is not necessarily required to provide the cutout portions 8, in correspondence with all of the transfer portions 6t. For example, the cutout portions 8, may be provided in correspondence with every other or every third of the other transfer portions 6t.

Reference numeral 9 denotes an input section provided on the input terminal side of the center CCD shift register 5c from among the three CCD shift registers 5a, 5b and 5c. The input section 9 is comprised of an n+-type source region 10 for supplying electrons in response to a predetermined electrical potential Ea, an input gate electrode IG, and a fixed potential (Ea) electrode 11.

This input section 9 supplies the electrons inside the source region 10 to the input terminal of the CCD shift register 5b when the input gate electrode IG reaches a predetermined level. There are no input sections in the CCD shift registers 5a and 5c.

Reference numeral 12 denotes an output section provided on the output terminal side of the three CCD shift registers 5a, 5b and 5c. The output section 12 is comprised of an output gate electrode 13, floating diffusions 14a, 14b and 14c, a reset gate electrode 15, and reset drains 16a, 16b and 16c. This output section 12 is capable of taking out the outputs of each of the CCD shift registers 5a, 5b and 5c independently of each other. The difference I1–I3 between the output current of the CCD shift register 5a and the output current of the CCD shift register 5c makes it possible to detect the intensity and the direction of the magnetic field. To be specific, the direction of the magnetic field (the lines of magnetic force) can be detected according to whether I1–I3 is positive or negative, and the intensity (the magnetic-flux density) of the magnetic field can be detected according to the magnitude of the absolute value.

That is, when there is no magnetic field, the electrons, which are a carrier, supplied from the input section 9 to the center CCD shift register 5b are transferred straight within the CCD shift register 5b, and their flow is not bent. Nevertheless, the electrons which flow leak slightly to the CCD shift registers 5a and 5c on both sides in the cutout portions 8, of the channel stop 3 and flow. However, since there is no deflection of the flow due to the magnetic field, the electric currents I1 and I3 which flow to the CCD shift registers 5a and 5b are substantially equal to each other. Therefore, I1–I3=0 is satisfied.

Incidentally, when a magnetic field is present, the flow of the electrons supplied from the input section 9 to the CCD shift register 5b is deflected by the magnetic field. As a result, a part of the electrons which flow through the CCD shift register 5b leak to either one of the CCD shift registers 5a or 5c. For example, this may be the CCD shift register 5a as indicated by the solid-line arrow each time the electrons pass through the cutout portions 8, of the channel stop 3.

The stronger the intensity of the magnetic field in a direction perpendicular to the surface of the magnetic-field detecting apparatus, the greater the leakage amount. This amount appears as a large value in the output I1 of the CCD shift register 5a. In contrast to this, since there is no leakage of electrons in the CCD shift register 5c, the value of the output I3 of the CCD shift register 5c is small. Therefore, I1–I3 becomes a positive value, and the greater the intensity of the magnetic field, namely the magnetic-flux density, the greater its absolute value. Thus, it is possible to detect the intensity of the magnetic field on the basis of the absolute value.

Further, since when the direction (the direction of the lines of magnetic force) of the magnetic field is opposite, the flow of the electrons is deflected toward the CCD shift register 5c side, and the electrons leak to the CCD shift register 5c each time the electrons pass through the cutout portions 8, as indicated by the dotted-line arrow. The stronger the magnetic field, the greater the leakage amount. This amount appears as a large value in the output I3 of the CCD shift register 5c.

In contrast to this, since there is no leakage of electrons in the CCD shift register 5a, the output I1 of the CCD shift register 5c is small. Therefore, I1–I3 becomes a negative value, and the absolute value thereof indicates the intensity of the magnetic field. Further, it is possible to determine the direction of the magnetic field according to whether the value is positive or negative, in other words, according to the magnitude relation between the outputs I1 and I3.

Further, it may be possible to detect the magnetic field on the basis of the output ratio I1/I3. In this case, the direction of the magnetic field (the lines of magnetic force) is determined according to whether the value is greater or smaller than 1. When the value is greater than 1, then, the greater the value, the stronger the magnetic field. When the value is smaller than 1, then the lesser the value, the stronger the magnetic field, and the closer the value is to 1, the weaker the magnetic field.

In such a magnetic-field detecting apparatus, it is possible to increase its sensitivity by lengthening each of the CCD shift registers 5a, 5b and 5c so as to increase the number of steps (the number of bits) thereof. This does not decrease the S/N ratio at all.

The length and the width of each of the CCD shift registers 5a, 5b and 5c exert a large influence upon the characteristics of the magnetic-field detecting apparatus. In particular, the unbalance of the shape and dimensions of the CCD shift registers 5a and 5c cause an offset. However, the shapes and sizes of the CCD shift registers 5a, 5b and 5c are not determined by a single mask for forming the channel stop 3, and there is no offset due to mask misalignment. Therefore, it is possible to easily provide a magnetic-field detecting apparatus in which there is no offset.

Figure 2:
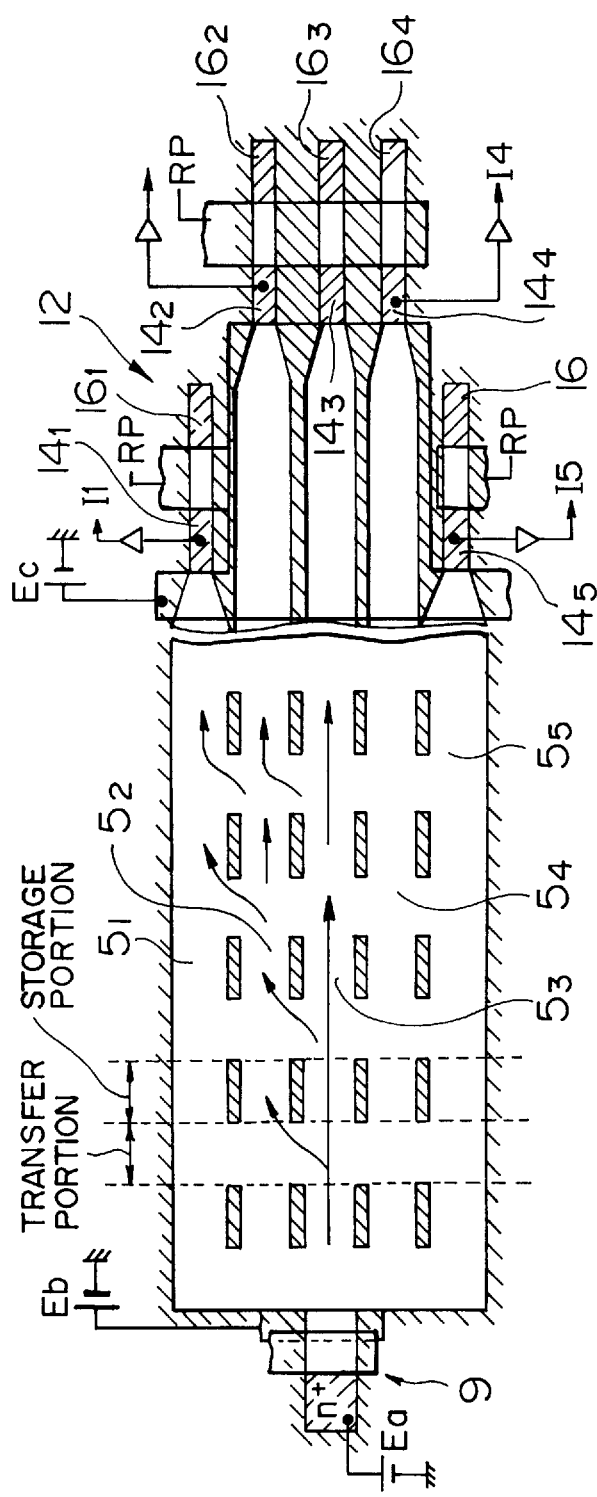
FIG. 2 is a plan view illustrating another embodiment of a magnetic-field detecting apparatus of the present invention.

FIG. 2 is a plan view of an alternate embodiment of a magnetic-field detecting apparatus of the present invention. In this embodiment of the magnetic-field detecting apparatus, the number of CCD shift registers 5 to be formed in parallel is five. Electrons are supplied from the input section 9 to a center CCD shift register 53, and a magnetic field is detected from outputs I1, I2, I3 and I4 of four CCD shift registers 51, 52, 54 and 55 other than the CCD shift register 53. I1–I5 makes it possible to obtain a low-sensitivity output Out1, and I2–I4 makes it possible to obtain a high-sensitivity output Out2. According to such magnetic-field detecting apparatus, it is possible to obtain a plurality of detection outputs of different sensitivity levels.

Figure 1B:
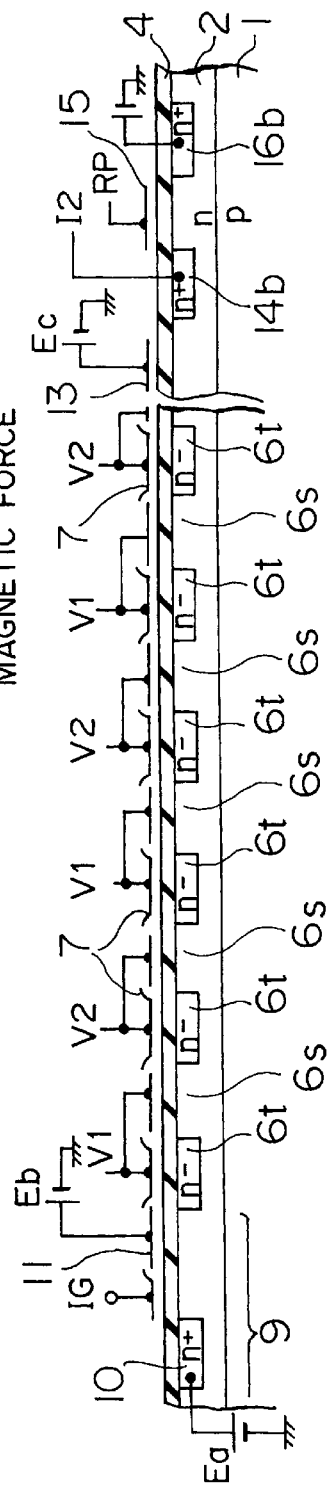
FIG. 1(B) is a sectional view taken along the line B—B of FIG. 1(A)
Figure 3:
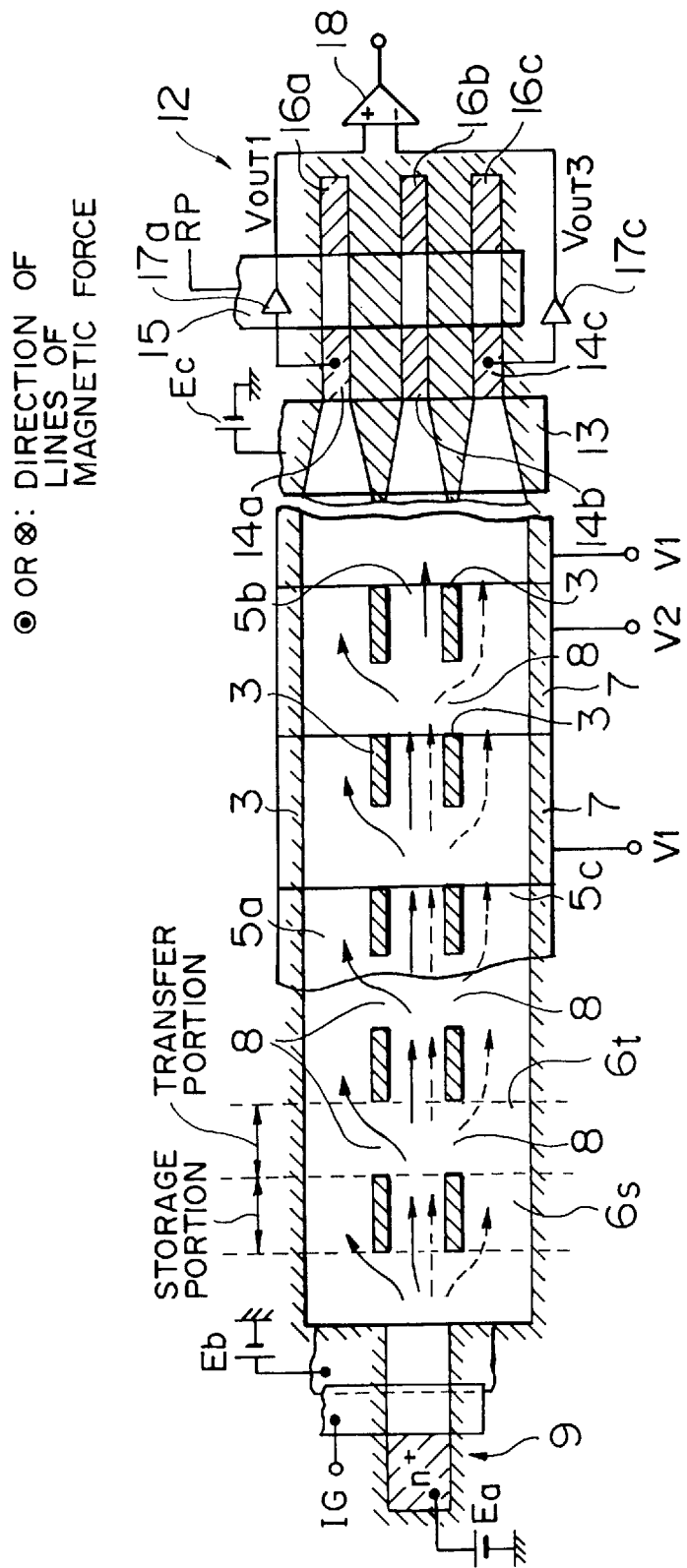
FIG. 3 illustrates an alternate embodiment of the magnetic field detecting apparatus of the present invention.

FIG. 3 shows another embodiment of a magnetic-field detecting apparatus of the present invention. This embodiment is the same as that in FIG. 1A and 1B except for the output section 12. The output section 12 is comprised of an output gate electrode 13, floating diffusions 14a, 14b and 14c, a reset gate electrode 15, and reset drains 16a, 16b and 16c, amplifiers 17a and 17c, comprising source follower circuits and a differential amplifier 18. The amplifiers 17a and 17c provide output voltages Vout 1 and Vout 3 respectively. The differential amplifier receives the output voltages Vout 1 and Vout 3 and outputs the difference Vout 1–Vout 3.

Figure 4:
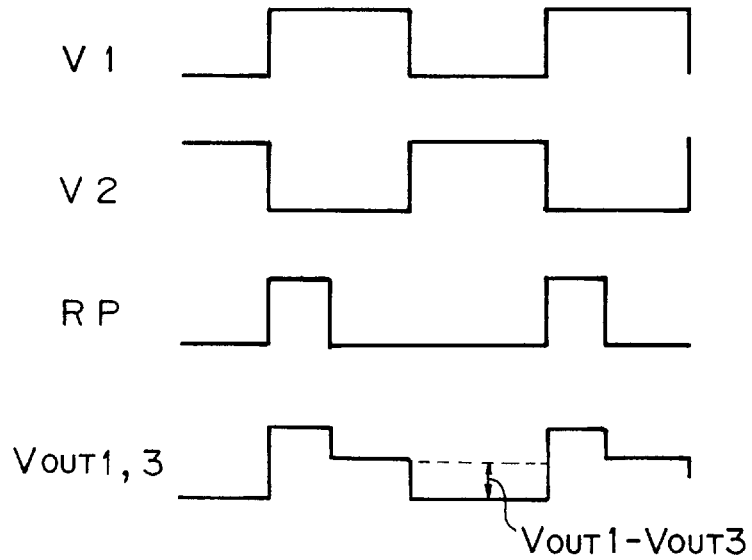
FIG. 4 illustrates the wave forms of two-phase transfer pulses.
Figure 5:
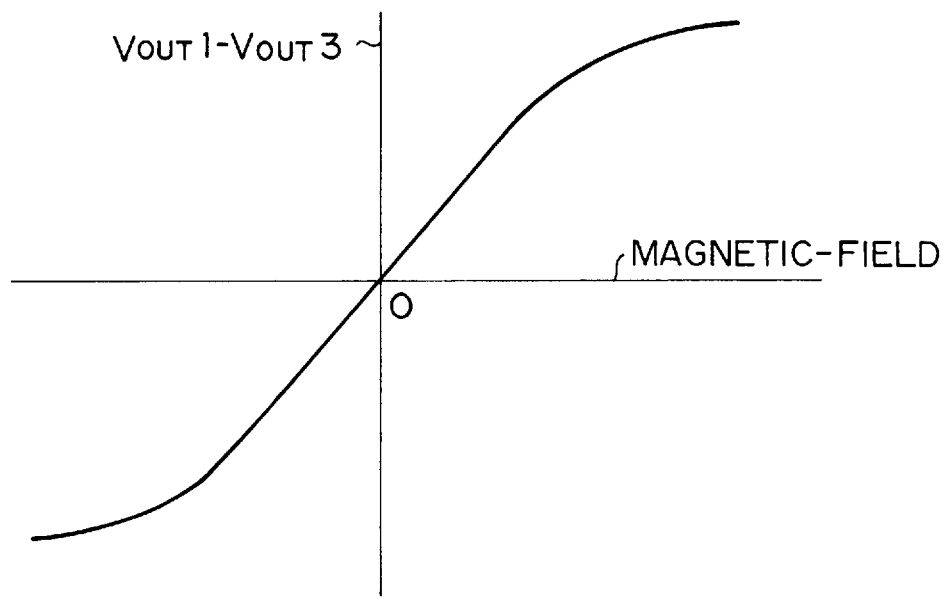
FIG. 5 illustrates the relationship between the output voltage difference and the magnitude of the magnetic field.
Figure 6:
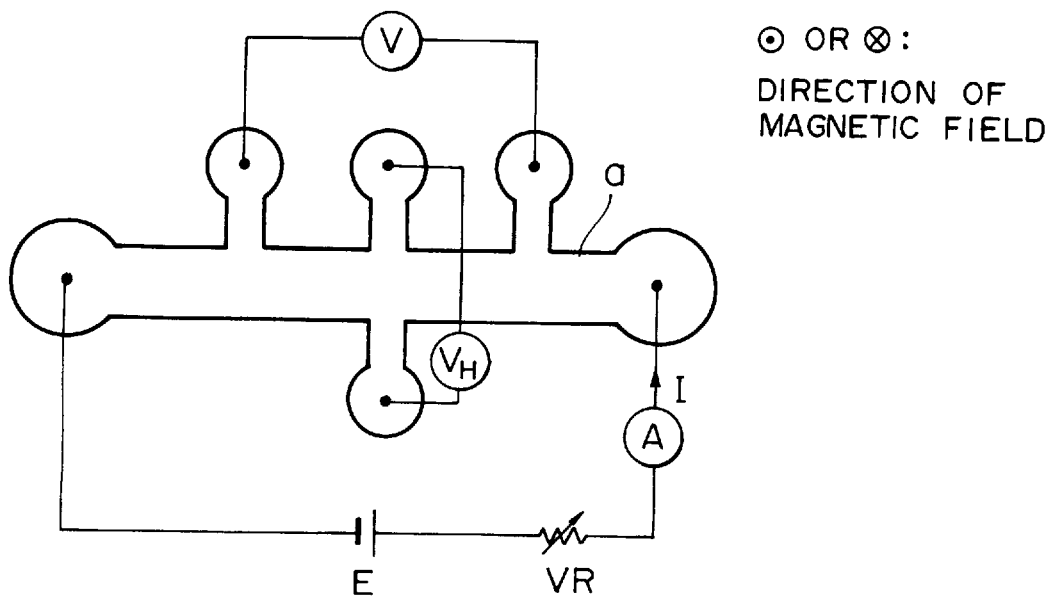
FIG. 6 illustrates an example of a conventional Hall Effect device.
Figure 7:
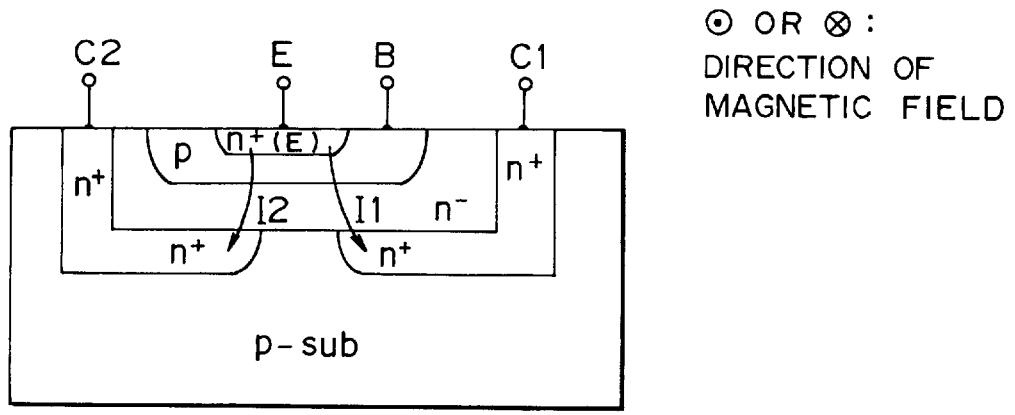
FIG. 7 illustrates another example of a conventional Hall Effect device.

FIG. 4 is a diagram of wave forms of the two-phase transfer pulses V1 and V2, the reset pulse RP and the output voltages V1 (solid line) and Vout 3 (broken line). FIG. 5 shows a relation between the output voltage difference Vout 1–Vout 3 and the magnetic field. The output voltage difference Vout 1–Vout 3 between the output voltage of the CCD shift register 5a and the output voltage of the CCD shift register 5c makes it possible to detect the intensity and the direction of the magnetic field. To be specific, the direction of the magnetic field can be detected according to whether Vout 1–Vout 3 is positive or negative and the intensity of the magnetic field can be detected according to the magnitude of the absolute value.

The magnetic-field detecting apparatus of the present invention is suitable for use as, for example, a non-contact rotation phase detector in a brushless motor in place of a commutator. In the past, a conventional hall element was often used as a non-contact rotation phase detector,. However, since the magnetic-field detecting apparatus of the present invention has high sensitivity, such apparatus is more preferable than in the past.

Further, the magnetic-field detecting apparatus of the present invention is suitable for measuring the magnetic field inside a cathode-ray tube used as a display unit of a television receiver, a computer or the like. That is, because the cathode-ray tube is susceptible to geomagnetism, there are many cathode-ray tubes in which measures for making them resistant to geomagnetism are taken. An example of such a device is found in copending U.S. patent application Ser. No. 08/673,015 filed Jul. 1, 1996 titled: "Cathode Ray Tube" which is incorporated herein by reference. Since the magnetic-field detecting apparatus of the present invention has high sensitivity, it is suitable for confirming the effect so that the undesired field may be corrected .

According to the magnetic-field detecting apparatus of the present invention, in the case in which a magnetic field in a direction at right angles to a CCD shift register occurs, the flow of the carrier which flows through each CCD shift register is deflected in a direction corresponding to the direction of the magnetic field, and a part of the carrier flows Therefore, it is possible to measure the intensity and the direction of the magnetic field from the difference or the ratio of the outputs of each of the CCD shift registers.

Further, since the deflection amount of the flow of the carrier with respect to the intensity of the same magnetic field can be increased on the basis of the length of the channel and the number of cutout portions of the channel stop, a magnetic-field detecting apparatus can be provided in which it is considerably easier to increase sensitivity without reducing S/N ratio, such as, for example, the number of electrons being reduced in a conventional hall element.

Further, the length and the width of each CCD shift register can be determined by a single mask for forming a channel stop, and variations due to the mask misalignment do not occur. Therefore, control in manufacturing is extremely easy as compared with the formation of each region of a bipolar transistor type magnetic-field detecting apparatus which is formed by a plurality of masks and which has a possibility that variations in the shape and the size due to mask misalignment may occur. In particular, this may be during the formation of the collector region.

Therefore, it is extremely easy to prevent an offset from occurring in the output of the magnetic-field detecting apparatus of the present invention.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim as my invention:

1. A magnetic-field detecting apparatus comprising:
   a plurality of adjacent parallel shift registers;
   a channel stop provided between the respective adjacent shift registers wherein said channel stop is cut out so as to make it possible for charges which pass through one of said adjacent shift registers to move toward another of said adjacent shift registers;

an input section for inputting said charges to one of said plurality of shift registers; and an output section provided at the end of said shift registers, said output section having at least two charge detectors for detecting said charges transferred from at least two of said shift registers respectively, wherein said shift registers are CCD shift registers and wherein each of said CCD shift registers comprises a transfer portion and a storage portion where said charges are temporarily stored, and said channel stop is cut out at a portion corresponding to said transfer portion.

2. A magnetic-field detecting apparatus according to claim 1 wherein said plurality of shift registers comprises first, second and third shift registers and said input section inputs charges into said second shift register.

3. A magnetic-field detecting apparatus according to claim 2, wherein said output section has first and third charge detectors for detecting charges transferred from said first and third shift registers respectively to output first and third electrical signals.

4. A magnetic-field detecting apparatus according to claim 3, wherein said output section further comprises a differential amplifier for receiving said first and third electrical signals to output a signal representing a magnetic-field.

5. A magnetic-field detecting apparatus according to claim 1 wherein said plurality of shift registers comprises first, second, third, fourth, and fifth shift registers and said input section inputs said charges to said third shift register.

6. A magnetic-field detecting apparatus according to claim 5, wherein said output section has first, second, fourth and fifth charge detectors for detecting said charges transferred from said first, second, fourth and fifth shift registers respectively to output first, second, fourth and fifth electrical signals.

7. A magnetic-field detecting apparatus according to claim 6, wherein said output section further comprises a processing means for receiving said first, second, fourth and fifth electrical signals to output a signal representing a magnetic-field.

8. A magnetic-field detecting apparatus according to claim 7, wherein said processing means outputs a first signal which is derived by processing said first and fifth electrical signals and a second signal which is derived by processing said second and fourth electrical signals.

9. A magnetic-field detecting apparatus comprising:

a charge transfer section;

an input section provided at a first end of said charge transfer section for inputting charges to said charge transfer-section;

an output section provided at a second end of said charge transfer section, said output section having first and second charge detectors for detecting charges transferred from said charge transfer section, to output first and second electrical signals respectively; and said charge transfer section having a first channel path connecting said input section and said first charge detector and a second channel path connecting said input section and said second charge detector, wherein said charge transfer section comprises a transfer portion for transferring charges and a storage portion wherein said charges are temporarily stored, and wherein said first and second channel paths are mutually connected at said transfer portion.

10. A magnetic-field detecting apparatus according to claim 9, wherein said output section further comprises a differential amplifier for receiving said first and second electrical signals and outputting a signal representing the magnetic-field.

11. A magnetic-field detecting apparatus according to claim 9, wherein said output section further comprises third and fourth charge detectors and said charge transfer section further comprises a third channel path connecting said input section and said third charge detector and a fourth channel path connecting said input section and said fourth charge detector.

12. A method for detecting a magnetic-field comprising the steps of:

providing a CCD charge transfer section comprising a plurality of channel paths;

transferring said charges through said plurality of channel paths;

detecting said charges transferred through said plurality of channel paths without recirculating the charges to produce a plurality of electrical signals corresponding the plurality of channel paths;

processing said plurality of electrical signals to produce a signal representing said magnetic-field.

13. A method according to claim 12, wherein said processing step comprises subtracting a second electrical signal from a first electrical signal.

14. A method according to claim 13, wherein said processing step comprises a step of determining a ratio between said first and second electrical signals.

\* \* \* \* \*